US012771346B2

(12) United States Patent
Wu

(10) Patent No.: US 12,771,346 B2
(45) Date of Patent: Oct. 20, 2026

(54) CONTROL DEVICE FOR POWER SWITCH, CONTROL METHOD FOR POWER SWITCH AND ELECTRONIC DISPLAY SYSTEM

(71) Applicant: Po-Yi Wu, New Taipei City (TW)

(72) Inventor: Po-Yi Wu, New Taipei City (TW)

(73) Assignee: ITE Tech. Inc., Hsinchu (TW)

( * ) Notice: Subject to any disclaimer, the term of this patent is extended or adjusted under 35 U.S.C. 154(b) by 292 days.

(21) Appl. No.: 18/404,897

(22) Filed: Jan. 5, 2024

(65) Prior Publication Data

US 2025/0125802 A1 Apr. 17, 2025

(30) Foreign Application Priority Data

Oct. 13, 2023 (TW) ................................ 112139105

(51) Int. Cl.
*H03K 17/94* (2006.01)
*G09G 3/34* (2006.01)

(52) U.S. Cl.
CPC ........... *H03K 17/94* (2013.01); *G09G 3/3453* (2013.01); *G09G 2330/021* (2013.01); *G09G 2370/16* (2013.01); *H03K 2217/94005* (2013.01)

(58) Field of Classification Search
CPC ......... H03K 17/94; H03K 2217/94005; G09G 2370/16; G09G 2330/021
USPC .......................................................... 73/40.5
See application file for complete search history.

(56) References Cited

U.S. PATENT DOCUMENTS 4,037,141 A * 7/1977 Fichtner ................. H01H 47/20 361/182
6,894,609 B2 * 5/2005 Menard ................ G08B 25/009 340/3.1
7,002,814 B2 * 2/2006 Kim .......................... G06F 1/26 713/320
7,010,332 B1 * 3/2006 Irvin ................... H04M 1/6066 379/428.02
7,995,034 B2 * 8/2011 Pope ..................... G06F 1/3271 713/320
8,032,771 B2 * 10/2011 Rangeley .................. G06F 1/26 713/320

(Continued)

FOREIGN PATENT DOCUMENTS

CN 201590845 9/2010
CN 109275056 1/2019

(Continued)

OTHER PUBLICATIONS

"Office Action of Taiwan Counterpart Application", issued on Mar. 21, 2024, p. 1-p. 8.

*Primary Examiner* — John E Breene
(74) *Attorney, Agent, or Firm* — JCIPRNET

(57) ABSTRACT

A control device for a power switch, a control method for the power switch, and an electronic display system are provided. The control device includes an acoustic sensor and a switch. The switch is coupled between a power supply and an external electronic device. The acoustic sensor senses an acoustic signal. In a standby mode, the acoustic sensor generates a switch control signal according to a frequency of the acoustic signal. The switch turns on or turns off a path for the external electronic device to receive power according to the switch control signal. In the standby mode, the acoustic sensor periodically and actively performs a generating operation of the switch control signal.

11 Claims, 4 Drawing Sheets

(56) References Cited

U.S. PATENT DOCUMENTS

| | | | | |
|---|---|---|---|---|
| 9,602,919 | B2 * | 3/2017 | Caballero | H04R 3/00 |
| 10,782,768 | B2 * | 9/2020 | Joo | G06F 1/324 |

FOREIGN PATENT DOCUMENTS

| | | | | |
|---|---|---|---|---|
| CN | 112086040 | * | 12/2020 | G09F 9/37 |
| CN | 118740122 | * | 10/2024 | H03K 17/687 |
| JP | 2009153267 | * | 7/2009 | |
| WO | WO-2017016274 A1 | * | 2/2017 | H03K 19/017545 |

* cited by examiner

CONTROL DEVICE FOR POWER SWITCH, CONTROL METHOD FOR POWER SWITCH AND ELECTRONIC DISPLAY SYSTEM

CROSS-REFERENCE TO RELATED APPLICATION

This application claims the priority benefit of Taiwan application serial no. 112139105, filed on Oct. 13, 2023. The entirety of the above-mentioned patent application is hereby incorporated by reference herein and made a part of this specification.

BACKGROUND

Technical Field

The disclosure relates to a switch control technology, and in particular, to a control device for a power switch, a control method for the power switch, and an electronic display system that may save power.

Description of Related Art

A control device for a switch of the existing electronic device (such as an electronic tag) mostly uses a wireless network (Wi-Fi) device or a Bluetooth device. In a standby mode, the wireless network device or the Bluetooth device has high standby power consumption, resulting in energy waste.

SUMMARY

In view of this, the disclosure provides a control device for a power switch, a control method for the power switch, and an electronic display system, which may effectively reduce a standby current.

A control device for a power switch of the disclosure includes an acoustic sensor and a switch. The switch is coupled between a power supply and an external electronic device. The acoustic sensor senses an acoustic signal. In a standby mode, the acoustic sensor generates a switch control signal according to a frequency of the acoustic signal. The switch turns on or turns off a path for the external electronic device to receive the power supply according to the switch control signal. In the standby mode, the acoustic sensor periodically and actively performs a generating operation of the switch control signal.

A control method for a power switch of the disclosure includes the following steps. An acoustic signal is sensed by an acoustic sensor. In a standby mode, a switch control signal is generated by the acoustic sensor according to a frequency of the acoustic signal. A path for an external electronic device to receive a power supply is turned on or turned off by the switch according to the switch control signal. In the standby mode, a generating operation of the switch control signal is periodically and actively performed by the acoustic sensor.

An electronic display system of the disclosure includes electronic paper, a power supply, a wireless network/Bluetooth device, and the above-mentioned control device. The wireless network/Bluetooth device is configured to update a state of the electronic paper. The control device is configured to control a turn-on or a turn-off state of a path for the wireless network/Bluetooth device to receive the power supply.

Based on the above, the control device for the power switch, the control method for the power switch, and the electronic display system provided by the disclosure can use a simple switch to control the power switch of the external electronic device by periodically and actively performing the generating operation of the switch control signal in the standby state so as to replace the wireless network device or Bluetooth device and reduce the standby current of the control device.

In order to make the above-mentioned features and advantages of the disclosure clearer and easier to understand, the following embodiments are given and described in details with accompanying drawings as follows.

DESCRIPTION OF THE EMBODIMENTS

Figure 1:
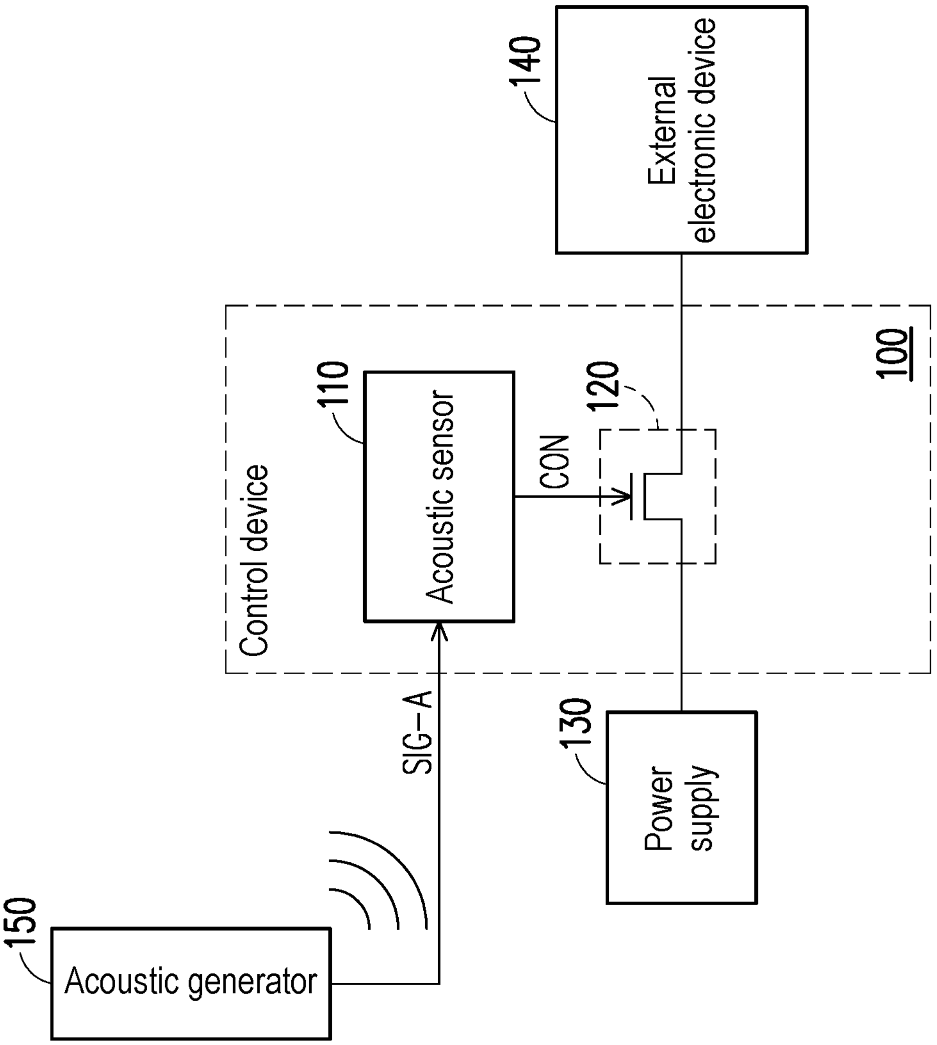
FIG. 1 is a schematic diagram of a control device for a power switch, a power supply, an external electronic device, and an acoustic generator according to an embodiment of the disclosure.

Some embodiments of the disclosure will be described in detail below with reference to the drawings. When the same reference numerals appear in different drawings, the reference numerals in the following description will be regarded as referring to the same or similar elements. The embodiments are only a part of the disclosure and do not disclose all possible implementations of the disclosure. More precisely, the embodiments are only examples within the protection scope of the disclosure.

FIG. 1 is a schematic diagram of a control device for a power switch, a power supply, an external electronic device, and an acoustic generator according to an embodiment of the disclosure. Please refer to FIG. 1. A control device 100 for a power switch includes an acoustic sensor 110 and a switch 120. The switch 120 is coupled between a power supply 130 and an external electronic device 140. The acoustic sensor 110 senses an acoustic signal SIG-A generated by an acoustic generator 150. The acoustic sensor 110 is, for example, a microelectromechanical systems (MEMS) microphone or an electret condenser microphone (ECM), and the disclosure is not limited thereto. The acoustic generator 150 is, for example, a smart phone, a notebook computer, a tablet computer, or other special amplifying equipment that may emit high-frequency signals, and the disclosure is not limited thereto.

In a standby mode, the acoustic sensor 110 periodically and actively performs a generating operation of a switch control signal CON. Specifically, the acoustic sensor 110 may turn on or turn off a path for the external electronic device 140 to receive the power supply 130 according to the switch control signal CON. To further explain, the acoustic sensor 110 may determine that the acoustic signal SIG-A has a single first frequency, a single second frequency, or a composite frequency composed of a plurality of frequencies to generate the switch control signal CON. For example, if a user wants to update a state of the external electronic device 140, the user may emit the acoustic signal SIG-A with the first frequency within a period of time by using the acoustic generator 150; on the contrary, if the user wants to turn off the external electronic device 140, the user may emit the acoustic signal SIG-A with the second frequency within a period of time by using the acoustic generator 150. The first frequency is, for example, 20 kHz, which is configured to indicate that the external electronic device 140 is to be turned on. The second frequency is, for example, 21 kHz, which is configured to indicate that the external electronic device 140 is to be turned off. Accordingly, the acoustic sensor 110 determines that a frequency of the acoustic signal SIG-A is the first frequency and generates the switch control signal CON configured to turn on the path for the external electronic device 140 to receive the power supply 130. On the other hand, the acoustic sensor 110 determines that the frequency of the acoustic signal SIG-A is the second frequency and generates the switch control signal CON configured to turn off the path for the external electronic device 140 to receive the power supply 130. In the embodiment, the switch control signal CON is a wireless signal. The switch 120 may turn on or turn off the path for the external electronic device 140 to receive the power supply 130 according to the switch control signal CON received from the acoustic sensor 110. In other words, the switch 120 may control the power switch of the external electronic device 140 according to the switch control signal CON.

In addition, the composite frequency may be composed of two or more different frequencies. For example, the composite frequency is composed of 20 kHz and 21 kHz. In an embodiment, if the user wants to update the state of the external electronic device 140, the user may emit the acoustic signal SIG-A with a composite frequency within a period of time by using the acoustic generator 150; on the contrary, if the user wants to turn off the external electronic device 140, the user may emit the acoustic signal SIG-A with another composite frequency within a period of time by using the acoustic generator 150. Specifically, the acoustic sensor 110 may receive the acoustic signal SIG-A within a period of time (for example, within 2 seconds). If the acoustic sensor 110 receives a composite frequency composed of 0.5 seconds of 20 kHz, 0.5 seconds of 21 kHz, 0.5 seconds of 20 kHz, and 0.5 seconds of 21 kHz within such a period, the acoustic sensor 110 may generate the switch control signal CON configured to turn on the path for the external electronic device 140 to receive the power supply 130. On the other hand, if the acoustic sensor 110 receives a composite frequency composed of 1 second of 20 kHz and 1 second of 21 kHz within such a period, the acoustic sensor 110 may generate the switch control signal CON configured to turn off the path for the external electronic device 140 to receive the power supply 130. Accordingly, the control device 100 may reduce the probability of malfunction (that is, generating an erroneous switch control signal CON) through the complexity of the composite frequency.

Incidentally, the composite frequency may also be composed of two or more frequencies, which is not limited thereto.

In the embodiment, the frequency of the acoustic signal SIG-A may fall at 15 kHz or more. The settings of the first frequency, the second frequency, and the composite frequency may be designed according to actual requirements, and the disclosure is not limited thereto.

In this way, in the standby state, the acoustic sensor 110 may periodically and actively perform the generating operation of the switch control signal CON, which may effectively reduce a standby current of the control device 100. In addition, the acoustic sensor 110 may determine the acoustic signal SIG-A with the single frequency or the composite frequency within a period of time to generate the switch control signal CON, which may reduce the probability of malfunction.

Figure 2:
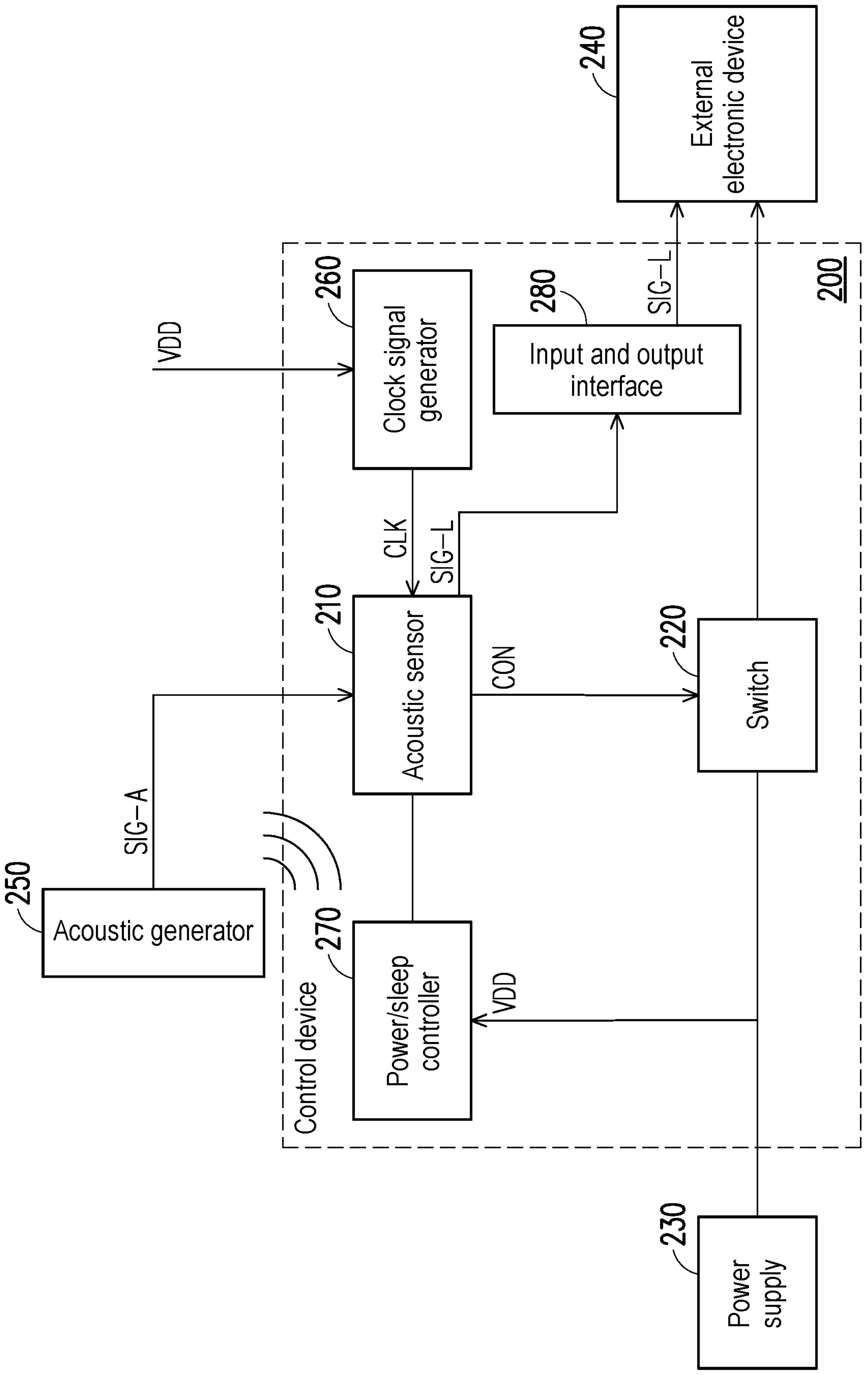
FIG. 2 is a schematic diagram of a control device for a power switch, a power supply, an external electronic device, and an acoustic generator according to an embodiment of the disclosure.

FIG. 2 is a schematic diagram of a control device for a power switch, a power supply, an external electronic device, and an acoustic generator according to an embodiment of the disclosure. Please refer to FIG. 2. A control device 200 for a power switch includes an acoustic sensor 210, a switch 220, a clock signal generator 260, a power/sleep controller 270, and an input and output interface 280. The clock signal generator 260 is coupled to the acoustic sensor 210. The acoustic sensor 210 is coupled to the clock signal generator 260, the power/sleep controller 270, and the input and output interface 280.

In a standby mode, the clock signal generator 260 and the power/sleep controller 270 are normally turned on. Specifically, the clock signal generator 260 and the power/sleep controller 270 may receive an operating voltage VDD from a power supply 230 to be normally turned on. The power/sleep controller 270 may periodically activate the acoustic sensor 210. The clock signal generator 260 may transmit a clock signal CLK to the acoustic sensor 210. The acoustic sensor 210 may receive an acoustic signal SIG-A from an acoustic generator 250 within a period of time according to the clock signal CLK, and actively perform the generating operation of a switch control signal CON.

In the embodiment, the switch 220 may be, for example, an NMOS transistor. The acoustic sensor 210 may determine that a frequency of the acoustic signal SIG-A within a period of time (for example, within 2 seconds) has a single first frequency, a single second frequency, or a composite frequency composed of a plurality of frequencies to generate the switch control signal CON. For example, when the acoustic sensor 210 determines that the frequency of the acoustic signal SIG-A within a period of time is the first frequency (for example, 20 kHz), the acoustic sensor 210 may generate the switch control signal CON configured to turn on the switch 220; on the contrary, when the acoustic sensor 210 determines that the frequency of the acoustic signal SIG-A within a period of time is the second frequency (for example, 21 kHz), the acoustic sensor 210 may generate the switch control signal CON configured to turn off the switch 220.

In addition, when the acoustic sensor 210 determines that the frequency of the acoustic signal SIG-A within a period of time is a composite frequency (for example, composed of 0.5 seconds of 20 kHz, 0.5 seconds of 21 kHz, 0.5 seconds of 20 kHz, and 0.5 seconds of 21 kHz), the acoustic sensor 210 may generate the switch control signal CON configured to turn on the switch 220. When the acoustic sensor 210 determines that the frequency of the acoustic signal SIG-A within a period of time is another composite frequency (for example, composed of 1 second of 20 kHz and 1 second of 21 kHz), the acoustic sensor 210 may generate the switch control signal CON configured to turn off the switch 220.

In this way, in the standby state, the acoustic sensor 210 may periodically and actively perform the generating operation of the switch control signal CON, which may effectively reduce a standby current of the control device 200. In addition, the acoustic sensor 210 may determine the acoustic signal SIG-A with the single frequency or the composite frequency within a period of time to generate the switch control signal CON, which may reduce the probability of malfunction.

On the other hand, when the control device 200 is in a low power state, the acoustic sensor 210 may send a low power notification signal SIG-L to an external electronic device 240 through the input and output interface 280. Specifically, the acoustic sensor 210 may be turned on periodically to detect a battery power of the control device 200. When the battery power of the control device 200 is insufficient (for example, when the battery power is less than 10%), the acoustic sensor 210 may send the switch control signal CON configured to turn on a path for the external electronic device 240 to receive the power supply 230 to the switch 220, and the acoustic sensor 210 may send the low power notification signal SIG-L to the external electronic device 240 through the input and output interface 280. Accordingly, the external electronic device 240 may receive the power supply 230 (that is, the power switch of the external electronic device 240 may be turned on) and display that the control device 200 is in a low power state via text, image, or color according to the low power notification signal SIG-L. For example, the external electronic device 240 is electronic paper. When the control device 200 is in a low power state, the electronic paper (that is, the external electronic device 240) may display a red light to remind the user that the control device 200 is in a low power state. In this way, the user may promptly replace the battery of the control device 200 in a low power state or charge the control device 200 in a low power state.

Figure 3:
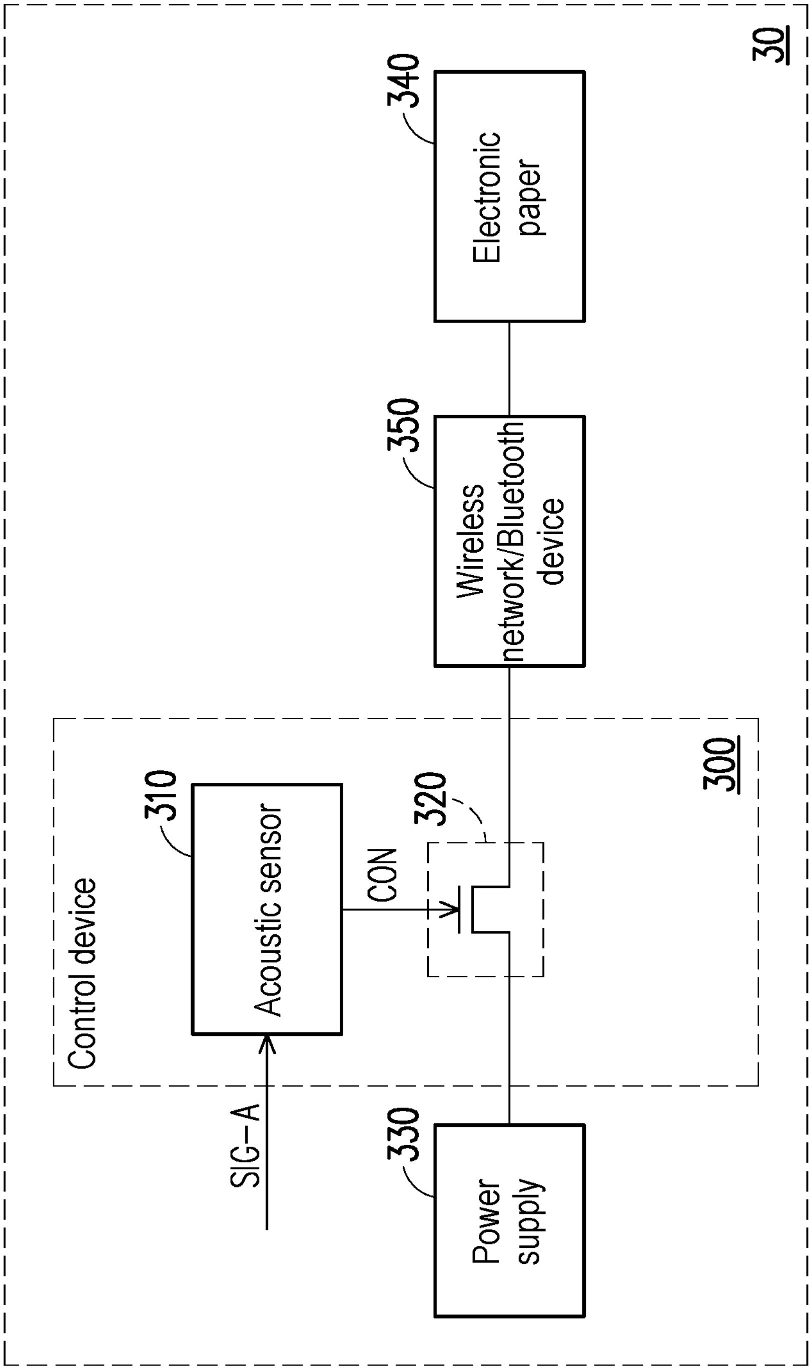
FIG. 3 is a schematic diagram of an electronic display system according to an embodiment of the disclosure.

FIG. 3 is a schematic diagram of an electronic display system according to an embodiment of the disclosure. Please refer to FIG. 3. An electronic display system 30 includes a control device 300, electronic paper 340, a power supply 330, and a wireless network/Bluetooth device 350. The control device 300 is similar to the control device 100 of FIG. 1 and includes an acoustic sensor 310 and a switch 320. The control device 300 is coupled to the power supply 330 and the wireless network/Bluetooth device 350. The control device 300 is configured to control a turn-on or a turn-off state of a power switch of the wireless network/Bluetooth device 350.

Specifically, the acoustic sensor 310 may generate a switch control signal CON configured to turn on or turn off a path for the wireless network/Bluetooth device 350 to receive the power supply 330 according to a frequency of an acoustic signal SIG-A. The acoustic sensor 310 may determine that the frequency of the acoustic signal SIG-A has a single first frequency, a single second frequency, or a composite frequency composed of a plurality of frequencies to generate the switch control signal CON. For example, when the acoustic sensor 310 determines that the frequency of the acoustic signal SIG-A is the first frequency, the acoustic sensor 310 may generate the switch control signal CON configured to turn on the path for the wireless network/Bluetooth device 350 to receive the power supply 330; on the contrary, when the acoustic sensor 310 determines that the frequency of the acoustic signal SIG-A is the second frequency, the acoustic sensor 310 may generate the switch control signal CON configured to turn off the path for the wireless network/Bluetooth device 350 to receive the power supply 330.

In addition, when the acoustic sensor 310 determines that the frequency of the acoustic signal SIG-A is a composite frequency, the acoustic sensor 310 may generate the switch control signal CON configured to turn on the path for the wireless network/Bluetooth device 350 to receive the power supply 330. In another embodiment, when the acoustic sensor 310 determines that the frequency of the acoustic signal SIG-A is a composite frequency, the acoustic sensor 310 may generate the switch control signal CON to turn off the path for the wireless network/Bluetooth device 350 to receive the power supply 330.

In the embodiment, the wireless network/Bluetooth device 350 may be configured to control a state of the electronic paper 340. For example, when a user wants to update the state of the electronic paper 340, the switch 320 receives the switch control signal CON configured to turn on the path for the wireless network/Bluetooth device 350 to receive the power supply 330. Accordingly, the power switch of the wireless network/Bluetooth device 350 may be turned on to update the state of the electronic paper 340. On the contrary, when the user does not need to update the state of the electronic paper 340, the switch 320 receives the switch control signal CON configured to turn off the path for the wireless network/Bluetooth device 350 to receive the power supply 330. Accordingly, the power switch of the wireless network/Bluetooth device 350 may be turned off.

In another embodiment, the wireless network/Bluetooth device 350 may be configured to control a smart door lock (not shown). For example, if the user wants to open or close the smart door lock, the control device 300 may turn on the power switch of the wireless network/Bluetooth device 350 to control the smart door lock by turning on the path for the wireless network/Bluetooth device 350 to receive the power supply 330. On the contrary, if the user does not need to open or close the smart door lock, the control device 300 may turn off the path for the wireless network/Bluetooth device 350 to receive the power supply 330.

In this way, in the standby state, the acoustic sensor 310 periodically and actively performs a generating operation of the switch control signal CON, which may effectively reduce a standby current of the control device 300. In addition, the acoustic sensor 310 may generate the switch control signal CON by determining the acoustic signal SIG-A with the composite frequency, which may reduce the probability of malfunction.

Figure 4:
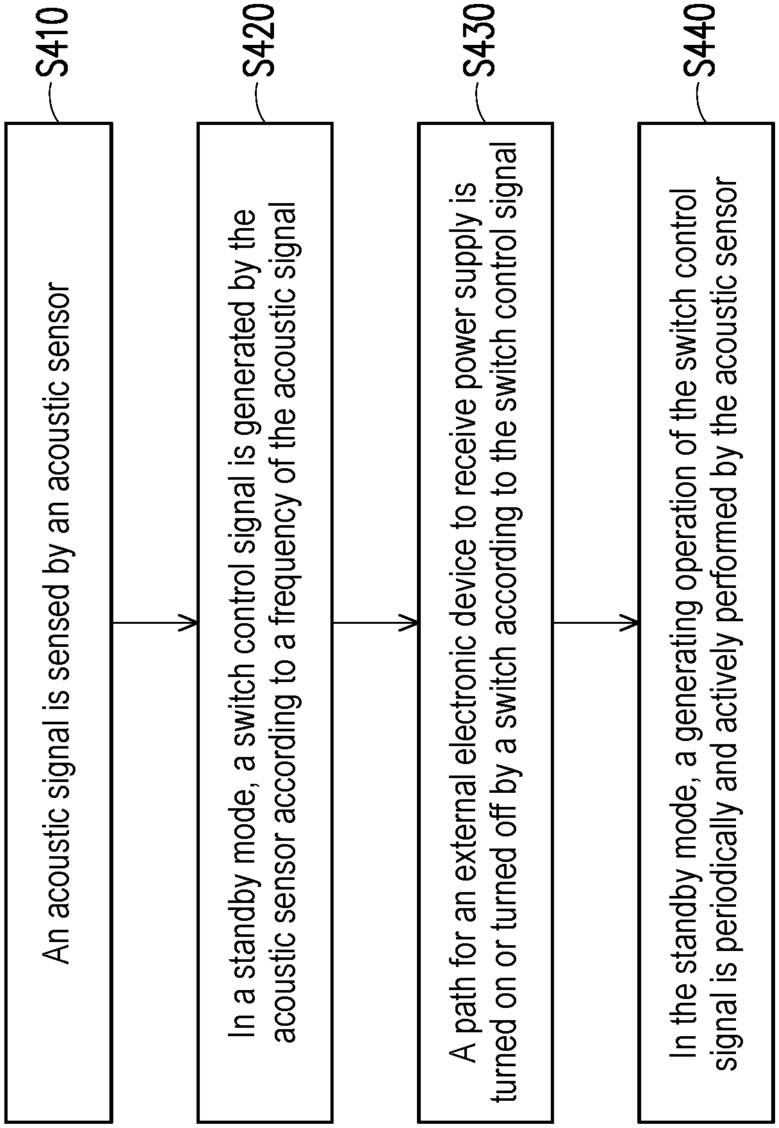
FIG. 4 is a flow chart of a control method for a power switch according to an embodiment of the disclosure.

FIG. 4 is a flow chart of a control method for a power switch according to an embodiment of the disclosure. The control method of the embodiment may be executed by the control device 100 of FIG. 1. Please refer to FIG. 1 and FIG. 4. In step S410, the acoustic signal SIG-A is sensed by the acoustic sensor 110. In step S420, in the standby mode, the switch control signal CON is generated by the acoustic sensor 110 according to the frequency of the acoustic signal SIG-A. Next, in step S430, the path for the external electronic device 140 to receive the power supply 130 is turned on or turned off by the switch 120 according to the switch control signal CON. Finally, in step S440, in the standby mode, the acoustic sensor 110 periodically and actively performs the generating operation of the switch control signal CON. The implementation details of steps S410 to S440 have been described in detail in the foregoing embodiments and will not be repeated here.

In summary, the control device for the power switch, the control method for the power switch, and the electronic display system of the disclosure may perform the generating operation of the switch control signal by periodically turning on the acoustic sensor in the standby state, and turn on or turn off the path for the external electronic device to receive the power supply through a simple switch, so as to replace the wireless network device or Bluetooth device and reduce the standby current of the control device. In addition, the acoustic sensor may generate the switch control signal according to the acoustic signal with the composite frequency to reduce the probability of malfunction. On the other hand, when the control device is in a low power state, the external electronic device may be used to remind the user that the control device is in a low power state, so that the user may promptly replace the battery of the control device in a low power state or charge the control device in a low power state.

What is claimed is:

1. A control device for a power switch, comprising:

an acoustic sensor, configured to sense an acoustic signal generated by an acoustic generator and generate a switch control signal according to a frequency of the acoustic signal in a standby mode; and a switch, coupled between a power supply and an external electronic device, and configured to turn on or turn off a path for the external electronic device to receive the power supply according to the switch control signal, wherein, in the standby mode, the acoustic sensor periodically and actively performs a generating operation of the switch control signal, wherein the acoustic sensor determines that the acoustic signal has a composite frequency composed of a plurality of frequencies to generate the switch control signal, wherein the frequency of the acoustic signal falls at 15 kHz or more.

2. The control device according to claim 1, further comprising:

a clock signal generator, coupled to the acoustic sensor;

a power/sleep controller, coupled to the acoustic sensor; and an input and output interface, coupled to the acoustic sensor, wherein, in the standby mode, the clock signal generator transmits a clock signal to the acoustic sensor, and the acoustic sensor receives the acoustic signal according to the clock signal.

3. The control device according to claim 2, wherein in the standby mode, the clock signal generator and the power/sleep controller are normally turned on.

4. The control device according to claim 2, wherein the acoustic sensor sends a low power notification signal to the external electronic device through the input and output interface when the control device is in a low power state.

5. The control device according to claim 1, wherein the external electronic device is electronic paper.

6. The control device according to claim 1, wherein the switch control signal is a wireless signal.

7. A control method for a power switch, comprising:

sensing an acoustic signal generated by an acoustic generator by an acoustic sensor;

generating a switch control signal according to a frequency of the acoustic signal by the acoustic sensor in a standby mode;

turning on or turning off a path for an external electronic device to receive a power supply according to the switch control signal by the switch;

periodically and actively performing a generating operation of the switch control signal by the acoustic sensor in the standby mode; and generating the switch control signal by the acoustic sensor by determining that the acoustic signal has a composite frequency composed of a plurality of frequencies, wherein the frequency of the acoustic signal falls at 15 kHz or more.

8. The control method according to claim 7, further comprising:

transmitting a clock signal to the acoustic sensor by a clock signal generator in the standby mode; and receiving the acoustic signal by the acoustic sensor according to the clock signal in the standby mode.

9. The control method according to claim 8, further comprising:

normally turning on the clock signal generator and a power/sleep controller in the standby mode.

10. The control method according to claim 8, further comprising:

sending a low power notification signal to the external electronic device through an input and output interface by the acoustic sensor when a control device is in a low power state.

11. An electronic display system, comprising:

electronic paper;

a power supply;

a wireless network/Bluetooth device, configured to update a state of the electronic paper; and a control device according to claim 1, configured to control a turn-on or a turn-off state of a path for the wireless network/Bluetooth device to receive the power supply.

* * * * *